United States Patent
Premutico et al.

(10) Patent No.: US 9,397,309 B2
(45) Date of Patent: Jul. 19, 2016

(54) ORGANIC ELECTROLUMINESCENT DEVICES

(71) Applicant: Universal Display Corporation, Ewing, NJ (US)

(72) Inventors: Mauro Premutico, Brooklyn, NY (US); Chuanjun Xia, Lawrenceville, NJ (US); Chun Lin, Yardley, PA (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/657,779

(22) Filed: Mar. 13, 2015

(65) Prior Publication Data

US 2015/0263305 A1    Sep. 17, 2015

Related U.S. Application Data

(60) Provisional application No. 61/952,314, filed on Mar. 13, 2014.

(51) Int. Cl.
*H01L 29/08* (2006.01)
*H01L 51/50* (2006.01)

(52) U.S. Cl.
CPC ......... *H01L 51/5012* (2013.01); *H01L 51/5016* (2013.01); *H01L 51/5024* (2013.01)

(58) Field of Classification Search
CPC . H01L 51/50; H01L 51/5012; H01L 51/5016; H01L 51/5024; H01L 51/00; H01L 51/52; H01L 51/56
USPC ................ 257/40, E51.018, E51.001; 438/46
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Adachi, Chihaya et al., "Organic Electroluminescent Device Having a Hole Conductor as an Emitting Layer," Appl. Phys. Lett., 55(15): 1489-1491 (1989).

(Continued)

*Primary Examiner* — Caleb Henry
(74) *Attorney, Agent, or Firm* — Duane Morris LLP

(57) ABSTRACT

An OLED having an organic layer formed of a dopant and a host, where the organic layer is disposed between an anode and a cathode is disclosed. The dopant's concentration level in the organic layer, along a direction perpendicular to the first and second planar surfaces of the organic layer, defines a novel concentration gradient that enhances the OLED's efficiency.

20 Claims, 12 Drawing Sheets

FIG. 5

(56) References Cited

U.S. PATENT DOCUMENTS

| | | | |
|---|---|---|---|
| 6,097,147 A | 8/2000 | Baldo et al. | |
| 6,294,398 B1 | 9/2001 | Kim et al. | |
| 6,303,238 B1 | 10/2001 | Thompson et al. | |
| 6,337,102 B1 | 1/2002 | Forrest et al. | |
| 6,468,819 B1 | 10/2002 | Kim et al. | |
| 6,528,187 B1 | 3/2003 | Okada | |
| 6,687,266 B1 | 2/2004 | Ma et al. | |
| 6,835,469 B2 | 12/2004 | Kwong et al. | |
| 6,921,915 B2 | 7/2005 | Takiguchi et al. | |
| 7,087,321 B2 | 8/2006 | Kwong et al. | |
| 7,090,928 B2 | 8/2006 | Thompson et al. | |
| 7,151,339 B2 | 12/2006 | Adamovich et al. | |
| 7,154,114 B2 | 12/2006 | Brooks et al. | |
| 7,250,226 B2 | 7/2007 | Tokito et al. | |
| 7,279,704 B2 | 10/2007 | Walters et al. | |
| 7,332,232 B2 | 2/2008 | Ma et al. | |
| 7,338,722 B2 | 3/2008 | Thompson et al. | |
| 7,393,599 B2 | 7/2008 | Thompson et al. | |
| 7,396,598 B2 | 7/2008 | Takeuchi et al. | |
| 7,431,968 B1 | 10/2008 | Shtein et al. | |
| 7,445,855 B2 | 11/2008 | Mackenzie et al. | |
| 7,534,505 B2 | 5/2009 | Lin et al. | |
| 7,675,057 B2* | 3/2010 | Drechsel | B82Y 10/00 257/184 |
| 9,112,163 B2* | 8/2015 | Uhrich | H01L 51/4246 |
| 2002/0034656 A1 | 3/2002 | Thompson et al. | |
| 2002/0134984 A1 | 9/2002 | Igarashi | |
| 2002/0158242 A1 | 10/2002 | Son et al. | |
| 2003/0138657 A1 | 7/2003 | Li et al. | |
| 2003/0151042 A1 | 8/2003 | Marks et al. | |
| 2003/0152802 A1 | 8/2003 | Tsuboyama et al. | |
| 2003/0175553 A1 | 9/2003 | Thompson et al. | |
| 2003/0230980 A1 | 12/2003 | Forrest et al. | |
| 2004/0036077 A1 | 2/2004 | Ise | |
| 2004/0041225 A1* | 3/2004 | Nemoto | H01L 21/263 257/458 |
| 2004/0137267 A1 | 7/2004 | Igarashi et al. | |
| 2004/0137268 A1 | 7/2004 | Igarashi et al. | |
| 2004/0174116 A1 | 9/2004 | Lu et al. | |
| 2005/0025993 A1 | 2/2005 | Thompson et al. | |
| 2005/0046337 A1 | 3/2005 | Chin et al. | |
| 2005/0112407 A1 | 5/2005 | Ogasawara et al. | |
| 2005/0238918 A1 | 10/2005 | Igarashi | |
| 2005/0238919 A1 | 10/2005 | Ogasawara | |
| 2005/0244673 A1 | 11/2005 | Satoh et al. | |
| 2005/0260441 A1 | 11/2005 | Thompson et al. | |
| 2005/0260449 A1 | 11/2005 | Walters et al. | |
| 2006/0008670 A1 | 1/2006 | Lin et al. | |
| 2006/0202194 A1 | 9/2006 | Jeong et al. | |
| 2006/0240279 A1 | 10/2006 | Adamovich et al. | |
| 2006/0250076 A1* | 11/2006 | Hofmann | H01L 51/002 313/504 |
| 2006/0251923 A1 | 11/2006 | Lin et al. | |
| 2006/0263635 A1 | 11/2006 | Ise | |
| 2006/0280965 A1 | 12/2006 | Kwong et al. | |
| 2007/0075636 A1 | 4/2007 | Tobise et al. | |
| 2007/0190359 A1 | 8/2007 | Knowles et al. | |
| 2007/0278938 A1 | 12/2007 | Yabunouchi et al. | |
| 2008/0015355 A1 | 1/2008 | Schafer et al. | |
| 2008/0018221 A1 | 1/2008 | Egen et al. | |
| 2008/0106190 A1 | 5/2008 | Yabunouchi et al. | |
| 2008/0124572 A1 | 5/2008 | Mizuki et al. | |
| 2008/0136321 A1* | 6/2008 | Do | H01L 51/5092 313/504 |
| 2008/0220265 A1 | 9/2008 | Xia et al. | |
| 2008/0297033 A1 | 12/2008 | Knowles et al. | |
| 2009/0008605 A1 | 1/2009 | Kawamura et al. | |
| 2009/0009065 A1 | 1/2009 | Nishimura et al. | |
| 2009/0017330 A1 | 1/2009 | Iwakuma et al. | |
| 2009/0026936 A1 | 1/2009 | Satou et al. | |
| 2009/0026937 A1 | 1/2009 | Kinoshita et al. | |
| 2009/0026938 A1 | 1/2009 | Okada et al. | |
| 2009/0026940 A1 | 1/2009 | Okada et al. | |
| 2009/0030202 A1 | 1/2009 | Iwakuma et al. | |
| 2009/0039776 A1 | 2/2009 | Yamada et al. | |
| 2009/0045730 A1 | 2/2009 | Nishimura et al. | |
| 2009/0045731 A1 | 2/2009 | Nishimura et al. | |
| 2009/0101870 A1 | 4/2009 | Pakash et al. | |
| 2009/0108737 A1 | 4/2009 | Kwong et al. | |
| 2009/0115316 A1 | 5/2009 | Zheng et al. | |
| 2009/0165846 A1 | 7/2009 | Johannes et al. | |
| 2009/0167162 A1 | 7/2009 | Lin et al. | |
| 2009/0179554 A1 | 7/2009 | Kuma et al. | |
| 2010/0184942 A1* | 7/2010 | Chen | C07D 209/82 528/423 |
| 2010/0187985 A1 | 7/2010 | Kinoshita et al. | |
| 2010/0193776 A1 | 8/2010 | Kinoshita et al. | |
| 2011/0297954 A1* | 12/2011 | Okamoto | H01L 29/08 257/76 |
| 2012/0132900 A1* | 5/2012 | Fujita | H05B 33/10 257/40 |
| 2014/0117337 A1* | 5/2014 | Jung | H01L 51/5044 257/40 |
| 2014/0239285 A1* | 8/2014 | Wang | H01L 51/504 257/40 |
| 2015/0123096 A1* | 5/2015 | MacKenzie | H01L 51/5032 257/40 |
| 2015/0171359 A1* | 6/2015 | Forrest | H01L 51/5016 257/40 |

FOREIGN PATENT DOCUMENTS

| | | |
|---|---|---|
| EP | 2034538 | 3/2009 |
| JP | 2001319779 | 11/2001 |
| JP | 200511610 | 1/2005 |
| JP | 2007123392 | 5/2007 |
| JP | 2007254297 | 10/2007 |
| JP | 2008074939 | 4/2008 |
| JP | 2010157606 | 7/2010 |
| JP | 2011100943 | 5/2011 |
| WO | 0139234 | 5/2001 |
| WO | 0202714 | 1/2002 |
| WO | 0215645 | 2/2002 |
| WO | 03040257 | 5/2003 |
| WO | 03060956 | 7/2003 |
| WO | 2004093207 | 10/2004 |
| WO | 2004107822 | 12/2004 |
| WO | 2005014551 | 2/2005 |
| WO | 2005019373 | 3/2005 |
| WO | 2005030900 | 4/2005 |
| WO | 2005089025 | 9/2005 |
| WO | 2005123873 | 12/2005 |
| WO | 2006009024 | 1/2006 |
| WO | 2006056418 | 6/2006 |
| WO | 2006072002 | 7/2006 |
| WO | 2006082742 | 8/2006 |
| WO | 2006098120 | 9/2006 |
| WO | 2006100298 | 9/2006 |
| WO | 2006103874 | 10/2006 |
| WO | 2006114966 | 11/2006 |
| WO | 2006132173 | 12/2006 |
| WO | 2007002683 | 1/2007 |
| WO | 2007004380 | 1/2007 |
| WO | 2007063754 | 6/2007 |
| WO | 2007063796 | 6/2007 |
| WO | 2008056746 | 5/2008 |
| WO | 2008101842 | 8/2008 |
| WO | 2008132085 | 11/2008 |
| WO | 2009000673 | 12/2008 |
| WO | 2009003898 | 1/2009 |
| WO | 2009008311 | 1/2009 |
| WO | 2009018009 | 2/2009 |
| WO | 2009009081 | 3/2009 |
| WO | 2009050290 | 4/2009 |
| WO | 2009021126 | 5/2009 |
| WO | 2009062578 | 5/2009 |
| WO | 2009063833 | 5/2009 |
| WO | 2009066778 | 5/2009 |
| WO | 2009066779 | 5/2009 |
| WO | 2009086028 | 7/2009 |

(56) References Cited

FOREIGN PATENT DOCUMENTS

| | | |
|---|---|---|
| WO | 2009100991 | 8/2009 |
| WO | 2012098944 | 7/2012 |

OTHER PUBLICATIONS

Adachi, Chihaya et al., "Nearly 100% Internal Phosphorescence Efficiency in an Organic Light Emitting Device," J. Appl. Phys., 90(10): 5048-5051 (2001).
Adachi, Chihaya et al., "High-Efficiency Red Electrophosphorescence Devices," Appl. Phys. Lett., 78(11)1622-1624 (2001).
Aonuma, Masaki et al., "Material Design of Hole Transport Materials Capable of Thick-Film Formation in Organic Light Emitting Diodes," Appl. Phys. Lett., 90:183503-1-183503-3.
Baldo et al., Highly Efficient Phosphorescent Emission from Organic Electroluminescent Devices, Nature, vol. 395, 151-154, (1998).
Baldo et al., Very high-efficiency green organic light-emitting devices based on electrophosphorescence, Appl. Phys. Lett., vol. 75, No. 3, 4-6 (1999).
Gao, Zhiqiang et al., "Bright-Blue Electroluminescence From a Silyl-Substituted ter-(phenylene-vinylene) derivative," Appl. Phys. Lett., 74(6): 865-867 (1999).
Guo, Tzung-Fang et al., "Highly Efficient Electrophosphorescent Polymer Light-Emitting Devices," Organic Electronics, 115-20 (2000).
Hamada, Yuji et al., "High Luminance in Organic Electroluminescent Devices with Bis(10-hydroxybenzo[h]quinolinato) beryllium as an Emitter," Chem. Lett., 905-906 (1993).
Holmes, R.J. et al., "Blue Organic Electrophosphorescence Using Exothermic Host-Guest Energy Transfer," Appl. Phys. Lett., 82(15):2422-2424 (2003).
Hu, Nan-Xing et al., "Novel High Tg Hole-Transport Molecules Based on Indolo[3,2-b]carbazoles for Organic Light-Emitting Devices," Synthetic Metals, 111-112:421-424 (2000).
Huang, Jinsong et al., "Highly Efficient Red-Emission Polymer Phosphorescent Light-Emitting Diodes Based on Two Novel Tris(1-phenylisoquinolinato-C2,N)iridium(III) Derivates," Adv. Mater., 19:739-743 (2007).
Huang, Wei-Sheng et al., "Highly Phosphorescent Bis-Cyclometalated Iridium Complexes Containing Benzoimidazole-Based Ligands," Chem. Mater., 16(12):2480-2488 (2004).
Hung, L.S. et al., "Anode Modification in Organic Light-Emitting Diodes by Low-Frequency Plasma Polymerization of CHF3," Appl. Phys. Lett., 78(5):673-675 (2001).
Ikai, Masamichi and Tokito, Shizuo, "Highly Efficient Phosphorescence From Organic Light-Emitting Devices with an Exciton-Block Layer," Appl. Phys. Lett., 79(2):156-158 (2001).
Ikeda, Hisao et al., "P-185 Low-Drive-Voltage OLEDs with a Buffer Layer Having Molybdenum Oxide," SID Symposium Digest, 37:923-926 (2006).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," J. Mater. Chem., 3(3):319-320 (1993).
Kanno, Hiroshi et al., "Highly Efficient and Stable Red Phosphorescent Organic Light-Emitting Device Using bis[2-(2-benzothiazoyl)phenolato]zinc(II) as host material," Appl. Phys. Lett., 90:123509-1-123509-3 (2007).
Kido, Junji et al., 1,2,4-Triazole Derivative as an Electron Transport Layer in Organic Electroluminescent Devices, Jpn. J. Appl. Phys., 32:L917-L920 (1993).
Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino) triphenylamine (m-MTDATA), as Hole-Transport Materials," Adv. Mater., 6(9):677-679 (1994).
Kwong, Raymond C. et al., "High Operational Stability of Electrophosphorescent Devices," Appl. Phys. Lett., 81(1) 162-164 (2002).
Lamansky, Sergey et al., "Synthesis and Characterization of Phosphorescent Cyclometalated Iridium Complexes," Inorg. Chem., 40(7):1704-1711 (2001).
Lee, Chang-Lyoul et al., "Polymer Phosphorescent Light-Emitting Devices Doped with Tris(2-phenylpyridine) Iridium as a Triplet Emitter," Appl. Phys. Lett., 77(15):2280-2282 (2000).
Lo, Shih-Chun et al., "Blue Phosphorescence from Iridium(III) Complexes at Room Temperature," Chem. Mater., 18 (21)5119-5129 (2006).
Ma, Yuguang et al., "Triplet Luminescent Dinuclear-Gold(I) Complex-Based Light-Emitting Diodes with Low Turn-On voltage," Appl. Phys. Lett., 74(10):1361-1363 (1999).
Mi, Bao-Xiu et al., "Thermally Stable Hole-Transporting Material for Organic Light-Emitting Diode an Isoindole Derivative," Chem. Mater., 15(16):3148-3151 (2003).
Nishida, Jun-ichi et al., "Preparation, Characterization, and Electroluminescence Characteristics of α-Diimine-type Platinum(II) Complexes with Perfluorinated Phenyl Groups as Ligands," Chem. Lett., 34(4): 592-593 (2005).
Niu, Yu-Hua et al., "Highly Efficient Electrophosphorescent Devices with Saturated Red Emission from a Neutral Osmium Complex," Chem. Mater., 17(13):3532-3536 (2005).
Noda, Tetsuya and Shirota,Yasuhiko, "5,5'-Bis(dimesitylboryl)-2,2'-bithiophene and 5,5"-Bis (dimesitylboryl)-2,2'5',2"-terthiophene as a Novel Family of Electron-Transporting Amorphous Molecular Materials," J. Am. Chem. Soc., 120 (37):9714-9715 (1998).
Okumoto, Kenji et al., "Green Fluorescent Organic Light-Emitting Device with External Quantum Efficiency of Nearly 10%," Appl. Phys. Lett., 89:063504-1-063504-3 (2006).
Palilis, Leonidas C., "High Efficiency Molecular Organic Light-Emitting Diodes Based On Silole Derivatives And Their Exciplexes," Organic Electronics, 4:113-121 (2003).
Paulose, Betty Marie Jennifer S. et al., "First Examples of Alkenyl Pyridines as Organic Ligands for Phosphorescent Iridium Complexes," Adv. Mater., 16(22):2003-2007 (2004).
Ranjan, Sudhir et al., "Realizing Green Phosphorescent Light-Emitting Materials from Rhenium(I) Pyrazolato Diimine Complexes," Inorg. Chem., 42(4):1248-1255 (2003).
Sakamoto,Youichi et al., "Synthesis, Characterization, and Electron-Transport Property of Perfluorinated Phenylene Dendrimers," J. Am. Chem. Soc., 122(8):1832-1833 (2000).
Salbeck, J. et al., "Low Molecular Organic Glasses for Blue Electroluminescence," Synthetic Metals, 91209-215 (1997).
Shirota, Yasuhiko et al., "Starburst Molecules Based on p-Electron Systems as Materials for Organic Electroluminescent Devices," Journal of Luminescence, 72-74:985-991 (1997).
Sotoyama, Wataru et al., "Efficient Organic LIght-Emitting Diodes with Phosphorescent Platinum Complexes Containing N^C^N-Coordinating Tridentate Ligand," Appl. Phys. Lett., 86:153505-1-153505-3 (2005).
Sun, Yiru and Forrest, Stephen R., "High-Efficiency White Organic Light Emitting Devices with Three Separate Phosphorescent Emission Layers," Appl. Phys. Lett., 91:263503-1-263503-3 (2007).
T. Östergård et al., "Langmuir-Blodgett Light-Emitting Diodes Of Poly(3-Hexylthiophene) Electro-Optical Characteristics Related to Structure," Synthetic Metals, 87:171-177 (1997).
Takizawa, Shin-ya et al., "Phosphorescent Iridium Complexes Based on 2-Phenylimidazo[1,2-α]pyridine Ligands Tuning of Emission Color toward the Blue Region and Application to Polymer Light-Emitting Devices," Inorg. Chem., 46(10):4308-4319 (2007).
Tang, C.W. and VanSlyke, S.A., "Organic Electroluminescent Diodes," Appl. Phys. Lett., 51(12):913-915 (1987).
Tung, Yung-Liang et al., "Organic Light-Emitting Diodes Based on Charge-Neutral Ru II PHosphorescent Emitters," Adv. Mater., 17(8)1059-1064 (2005).
Van Slyke, S. A. et al., "Organic Electroluminescent Devices with Improved Stability," Appl. Phys. Lett., 69 (15):2160-2162 (1996).
Wang, Y. et al., "Highly Efficient Electroluminescent Materials Based on Fluorinated Organometallic Iridium Compounds," Appl. Phys. Lett., 79(4):449-451 (2001).

(56) References Cited

OTHER PUBLICATIONS

Wong, Keith Man-Chung et al., A Novel Class of Phosphorescent Gold(III) Alkynyl-Based Organic Light-Emitting Devices with Tunable Colour, Chem. Commun., 2906-2908 (2005).

Wong, Wai-Yeung, "Multifunctional Iridium Complexes Based on Carbazole Modules as Highly Efficient Electrophosphors," Angew. Chem. Int. Ed., 45:7800-7803 (2006).

Liu, Zhiwei, et al., "Highly efficient two component phosphorescent organic light-emitting diodes based on direct hole injection into dopant and gradient doping," Organic Electronics 14 (2013) pp. 852-857.

Liu, Jun, et al., "Improved efficiency of blue phosphorescent organic light-emitting diodes with irregular stepwise-doping emitting layers," Phys. Status Solidi A 210, No. 3, pp. 489-493 (2013).

Lei, Gangtie, et al., "Improved performance of electrophosphorescent organic light-emitting diode by graded doped emissing layer," Japanese Journal of Applied Physics, vol. 43, No. 9A/B, 2004, pp. L1226-L1228.

* cited by examiner

ORGANIC ELECTROLUMINESCENT DEVICES

CROSS-REFERENCE TO RELATED APPLICATIONS

This application is a Non-provisional application claiming priority under 35 U.S.C. §119(e) of U.S. Provisional Patent Application Ser. No. 61/952,314, filed Mar. 13, 2014, the entire contents of which is incorporated herein by reference.

PARTIES TO A JOINT RESEARCH AGREEMENT

The claimed invention was made by, on behalf of, and/or in connection with one or more of the following parties to a joint university corporation research agreement: The Regents of the University of Michigan, Princeton University, University of Southern California, and Universal Display Corporation. The agreement was in effect on and before the date the claimed invention was made, and the claimed invention was made as a result of activities undertaken within the scope of the agreement.

FIELD OF THE INVENTION

The present disclosure relates to improved device structure for organic light-emitting devices. Particularly, this present disclosure discloses a gradient doping profile for the emissive layer.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

Organic electroluminescent devices utilize the radiative decay of excitons formed inside the emissive layer. The position of exciton formation and migration play very important role on the stability and efficiency of the devices. When holes and electrons are injected to the devices, they travel in the emissive layer, recombine, and form excitons. When the recombination zone is too narrow or close to HTL and ETL interfaces, a large buildup of charge and high concentration of excitons can occur, which can cause polaron-exciton interaction and triplet-triplet annihilation. These interactions can adversely affect the device performance, generally shortening the device lifetime. In order to increase device efficiency and improve lifetime, it is desirable to have a wider recombination zone and lower exciton concentration in the emissive layer. Therefore, the charge transporting properties of the emissive layer is important.

There are several methods for controlling the charge transporting properties of the emissive layer, such as designing compounds with the desired charge transporting properties, using a mixture of compounds with preferred transporting properties, and changing the concentration of the components in the emissive layer. Among these approaches, changing the concentration of the components in the EML to provide a gradient of materials offers a convenient way to regulate the charge transport and recombination.

Among the references that disclose gradient doping in the EML, either a hole transporting emitter such as an iridium complex or an electron transporting emitter such as a platinum complex was used. The doping concentration of the metal complex decreased or increased gradually from the anode to the cathode side. In general, the hole transporting metal complex concentration decreases away from the anode to reduce the hole transporting rate. The opposite is true for an electron transporting metal complex. Recently, Gufeng He et al. reported devices having irregular step-wise doping concentration gradients in the EML that resulted in higher efficiency than both the uniform doping and the regular gradient doping. (Phys. Status Solidi A 210, No. 3, 489-493 (2013) irregular stepwise doping in OLEDs). In Gufeng's device, bis[(4,6-difluorophenyl)-pyridinato-N,C2'](picolinate)Ir (III), FIrpic, an electron transporting metal complex, was used as the emitter. The doping concentration gradient of FIrpic was first increased and then reduces from the anode to the cathode side.

The inventors have devised novel doping concentration gradients in order to achieve further improvements in OLED device efficiency.

SUMMARY OF THE INVENTION

According to an embodiment, a device comprising one or more organic light emitting devices, at least one of the organic light emitting devices comprising: an anode; a cathode that is parallel to the anode; and a first organic layer disposed between the anode and the cathode and having a first planar surface and a second planar surface that are parallel to the anode and the cathode and having a perpendicular distance L between the first planar surface and the second planar surface, wherein the anode is closer to the first planar surface than to the second planar surface; wherein the first organic layer comprises a dopant material and a host material; wherein the dopant material has a concentration level in the first organic layer that is between 0.1-90 wt. % and is generally constant throughout the first organic layer along a direction parallel to the first and second planar surfaces; wherein the dopant material's concentration level in the first organic layer along a direction perpendicular to the first and second planar surfaces, is not generally constant and defines a first concentration gradient along the direction perpendicular to the first and second planar surfaces; wherein the first concentration gradient has a first concentration level within a distance that is no more than 0.1 L from the first planar surface, a second concentration level within a distance that is no more than 0.1 L from the second planar surface, and a third concentration level at a distance less than 0.5 L from the first planar surface, wherein the third concentration level is greater than the first concentration level and the second concentration level.

The novel gradient doping embodiments described herein provide an effective means of managing the EML properties of an OLED device based on the designer's preferred structure and intended use, which may require differing levels of desired lifetime, efficiency, voltage and charge characteristics, and temperature performance. These novel gradient characteristics can provide design freedoms which are not currently available to product designers without significant change to the manufacturing system used to make the OLED devices. Utilizing the embodiments of the present invention, the OLED device may be modified to manage the radiative decay of excitons formed inside the emissive layer. The present invention permits modifications of product performance that will result in how holes and electrons are injected to the devices, and how they travel in the emissive layer, recombine, and form excitons. This results in modification of the characteristics which can accommodate recombination zones relative to the HTL and ETL interfaces, control the amount of buildup of charge and concentration of excitons in those and adjacent areas, which can impact polaron-exciton interaction and triplet-triplet annihilation. These interactions can affect the device performance, including the device lifetime. The current invention allows for manipulation of the charge transporting properties within and in areas adjacent to the emissive layer through, inter alia, the utilization of a wider recombination zone and lower exciton concentration in the emissive layer.

According to another aspect, the device can be a consumer product, an electronic component module, an organic light-emitting device, and/or a lighting panel.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

Figure 1:
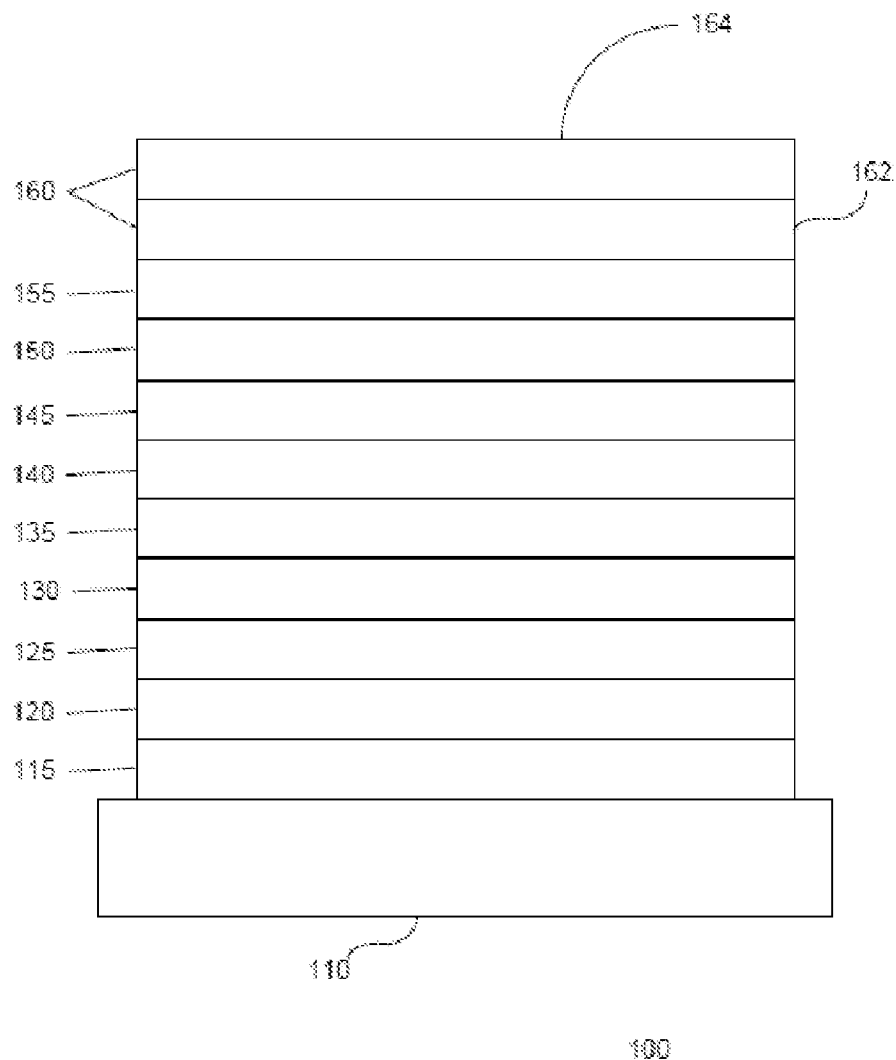
FIG. 1 shows a structure of an example of an organic light emitting device in which the present invention can be applied.

FIG. 1 shows an example of an organic light emitting device 100 in which the present invention can be applied. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. The emissive layer 135 comprises at least one emissive dopant material and a host material and can be formed so that the emissive dopant material is provided in the emissive layer 135 with a novel concentration gradient as described herein. Device 100 may be fabricated by depositing the layers described, in order. The properties and functions of these various layers, as well as example materials, are described in more detail in U.S. Pat. No. 7,279,704 at cols. 6-10, which are incorporated by reference.

Figure 2:
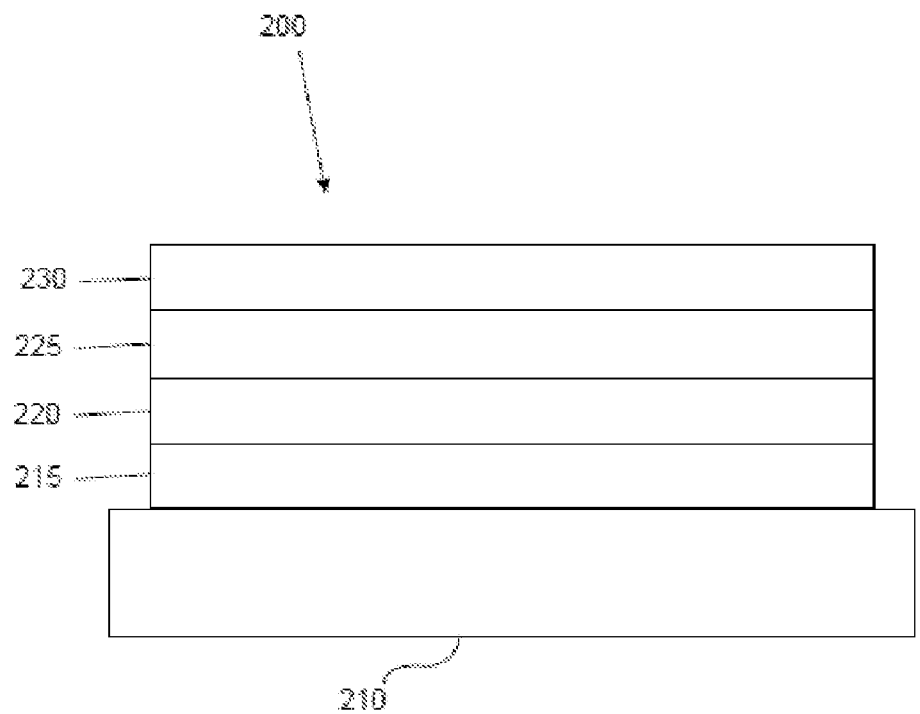
FIG. 2 shows a structure of an example of an inverted organic light emitting device that does not have a separate electron transport layer in which the present invention can be applied.

FIG. 2 shows an example of an inverted OLED 200 in which the present invention can be applied. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100. According to an embodiment of the present disclosure, the emissive layer 220 comprises at least one emissive dopant material and a host material and can be formed so that the emissive dopant material is provided in the emissive layer 220 with a novel concentration gradient as described herein.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Organic electroluminescent devices utilize the radiative decay of excitons formed inside the emissive layer. The position of exciton formation and migration play very important role on the stability and efficiency of the devices. When holes and electrons are injected to the devices, they travel in the emissive layer, recombine, and form excitons. When the recombination zone is too narrow or close to HTL and ETL interfaces, a large buildup of charge and high concentration of exctions can occur, which can cause polaron-exciton interaction and triplet-triplet annihilation. These interactions can adversely affect the device performance, generally resulting in short device lifetime. To increase device efficiency and improve lifetime, it is desirable to have a wider recombination zone and lower exciton concentration in the emissive layer. Therefore, the change transporting properties of the emissive layer is important. There are several methods to control the charge transporting properties in the emissive layer, such as designing compounds with the right charge transporting properties, using a mixture of compounds with preferred transporting properties, and changing the concentration of the components in the emissive layer. Among these approaches, changing the concentration of the components in the EML to provide a gradient of materials offers a convenient way to regulate the charge transport and recombination.

Among the references that disclose gradient doping in the EML, either a hole transporting emitter such as an iridium complex or an electron transporting emitter such as a platinum complex was used. The doping concentration of the metal complex decreased or increased gradually from the anode to the cathode side. In general, the hole transporting metal complex concentration decreases away from the anode to reduce the hole transporting rate. The opposite is true for an electron transporting metal complex. Recently, Gufeng He et al. reported an irregular doping in the EML that resulted in higher efficiency than both the uniform doping and the regular gradient doping. (Phys. Status Solidi A 210, No. 3, 489-493 (2013) In their device, FirPic, an electron transporting metal complex, was used as the emitter. The doping concentration of Firpic was first increased and then reduced from the anode to the cathode side.

In the present disclosure, multiple doping concentration gradients with different gradient profiles for an organic layer in an OLED is disclosed. Such organic layer can be an emissive layer comprising one or more dopants and one or more host materials. The concentration gradient profiles can be continuous or stepwise as shown in FIGS. 4-12. This novel approach will enable much better modulation of the charge transport throughout each layer in the device, and reach the ideal recombination in the emissive layer, therefore achieving higher device efficiency and longer device life. Depending on the molecular structures of the host compounds and emitters, they may have very different charge transporting properties. Some host and emitter examples are shown below.

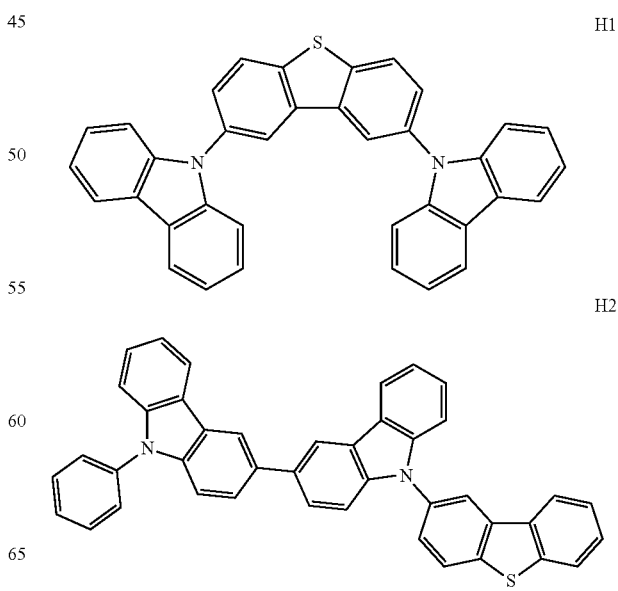

H3
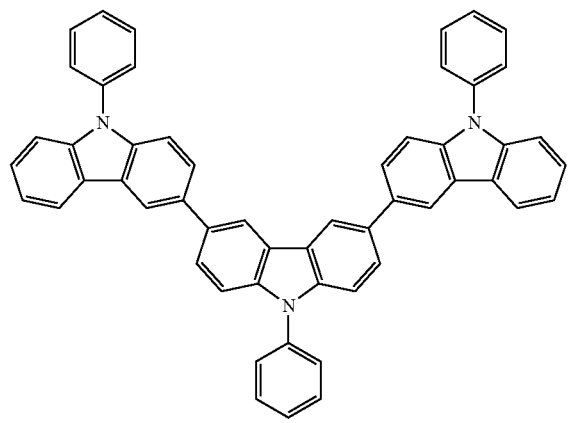
H7
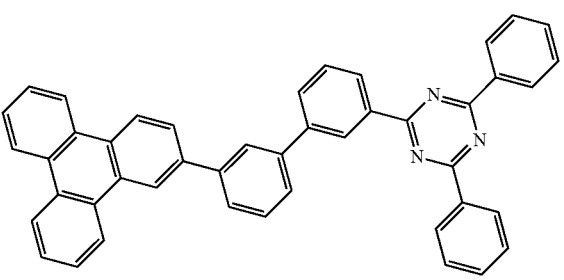
H4
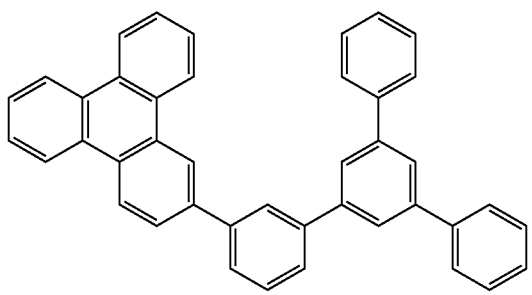
H8
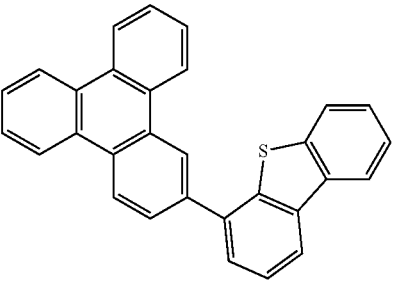
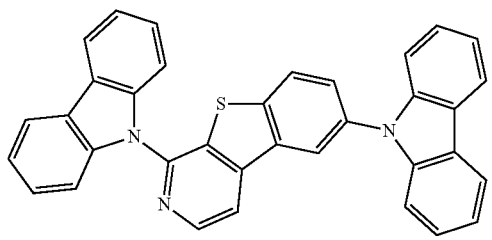
H9
H5
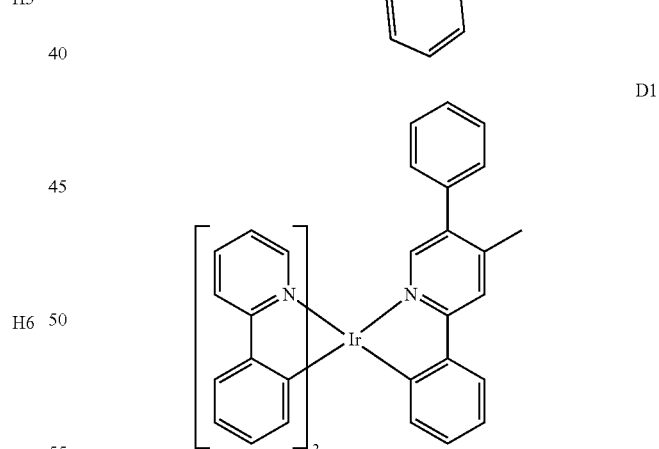
D1
H6
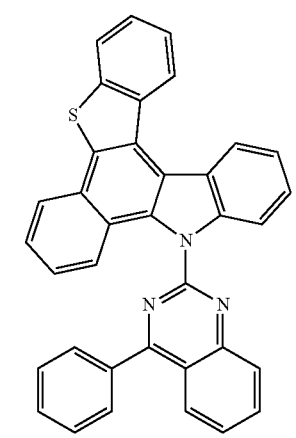
D2
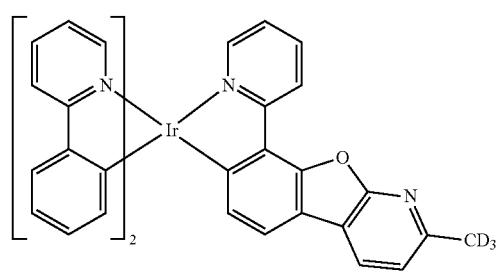

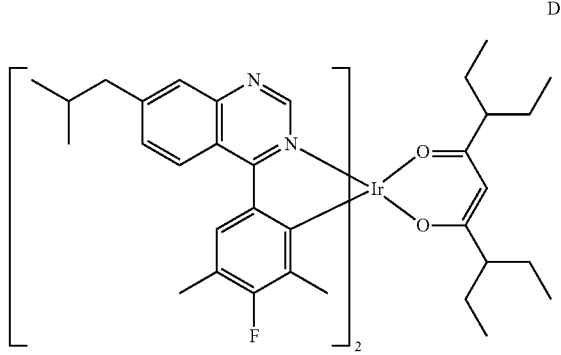

D3

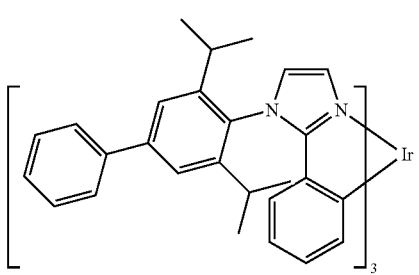

D4

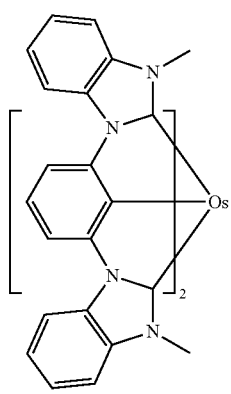

D5

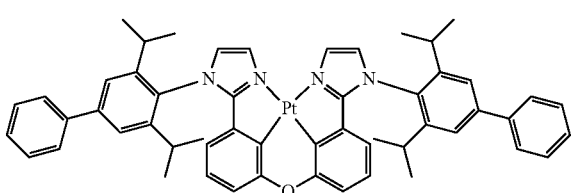

D6

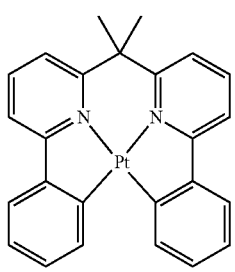

D7

For example, H1 is a deep HOMO hole transporting host whereas H2 and H3 are a lot more hole transporting with shallower HOMO. H4, H5, and H6 are bipolar hosts. They can transport both holes and electrons with a preference for electron transporting. On the contrary, H7 is a pure electron transporting host. H8 and H9 have very deep HOMO. They are almost equally unfriendly to electrons and holes. For the emitter compounds, iridium based compounds normally have a shallow HOMO, making them good for trapping and transporting holes. For example, D1 and D2 are typical hole traps. When introducing strong electron withdrawing groups on the phenyl ring, the HOMO level was pulled down, making it a less efficient hole trap. D4 and D5 have very shallow HOMO, making them extremely efficient hole traps. Once holes are injected in to D4 and D5, it will not travel far into the emissive layer. On the contrary, platinum based compounds do not trap holes. Based on these properties, one skilled in the art can choose the doping profiles to determine which is appropriate for the device.

The preferred embodiments described here provide an effective vehicle to modify the lifetime and efficiency, voltage drive requirements and overall efficiency of the specific organic layer that is the subject of the present invention. The specific quantitative impact will depend on the stack configuration utilized for the OLED device based on its intended use, the drive circuitry utilized, and other factors known to those skilled in the art. Although certain other doping gradient configurations have been described in the literature and used in the prior-art devices, such as the uniform doping concentration design used in most known commercial OLED devices, the invention described herein provides an effective methodology and system for managing the operational characteristics of the device without modifying the overall configuration of the device in a substantial way.

Figure 3:
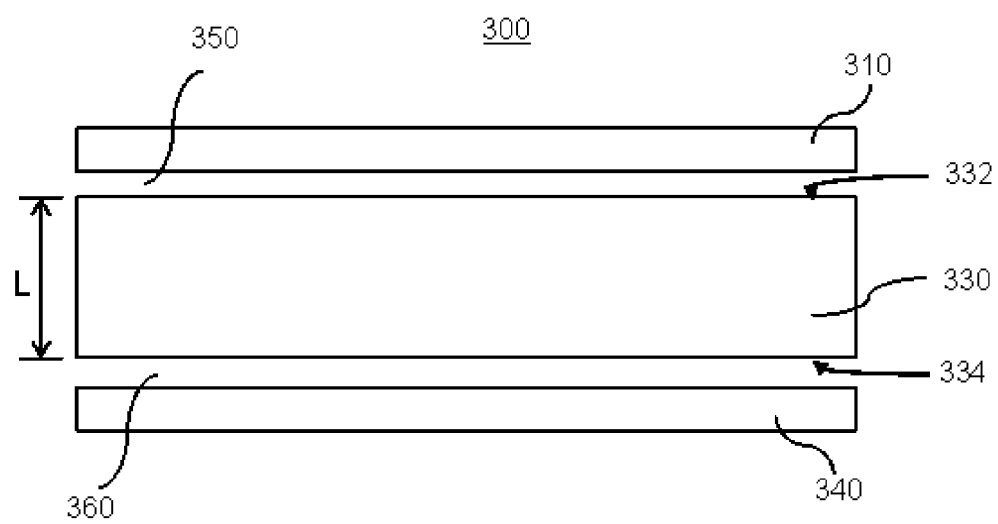
FIG. 3 shows another device structure in which the present invention can be applied.

According to an embodiment of the present disclosure, a device comprising one or more organic light emitting devices in which a novel dopant concentration gradient can be implemented is disclosed. Referring to FIG. 3, at least one of the organic light emitting devices 300 comprises: an anode 310; a cathode 340 that is parallel to the anode; and a first organic layer 330 disposed between the anode and the cathode and having a first planar surface 332 and a second planar surface 334 that are parallel to the anode and the cathode and having a distance L representing the perpendicular distance between the first planar surface and the second planar surface. In other words, L represents the thickness of the first organic layer 330. The first planar surface and the second planar surface of the first organic layer are defined such that the anode is closer to the first planar surface than the second planar surface.

In FIG. 3, the device 300 is shown with only the first organic layer 330 between the two electrodes for the purpose of discussing the concentration gradient profiles of the dopant materials in the organic layer. In actual implemented devices, there can be other functional layers between the organic layer 330 and the electrodes. For example, in the space 350 between the anode 310 and the organic layer 330 and the space 360 between the cathode 340 and the organic layer 330, other functional layers illustrated in the examples shown in FIGS. 1 and 2 can be provided.

The first organic layer 330 comprises a dopant material and a host material. The concentration level of the dopant material at a given point or a region in the first organic layer is between 0.1 to 90 wt. %. Along a direction parallel to the first and second planar surfaces, the concentration level of the dopant material is generally constant throughout the first organic layer. The terms "generally constant" as used herein means that the concentration level does not vary by more than ±2 wt. % as the dopant material is being deposited.

In contrast, along a direction perpendicular to the first and second planar surfaces, the dopant material's concentration level in the first organic layer changes and is not generally constant. The varying concentration level of the dopant material along a direction perpendicular to the first and second planar surfaces defines a first concentration gradient along the direction perpendicular to the first and second planar surfaces.

Referring to FIGS. 4, 5, 6, and 8, according to one embodiment of the present disclosure, the first concentration gradient has a first concentration level $C_1$ for a dopant in a first region that is within a distance of no more than 0.1 L from the first planar surface 332, a second concentration level $C_2$ for the dopant in a second region that is within a distance of no more than 0.1 L from the second planar surface 334, and a third concentration level $C_3$ for the dopant at a distance less than 0.5 L but greater than 0.1 L from the first planar surface. The first concentration gradient has a profile wherein the third concentration level $C_3$ is the maximum concentration level and, thus, is greater than the first concentration level $C_1$ and the second concentration level $C_2$. In the emissive layer, host compounds can function as hole and/or electron transporting materials. Dopants can also transport charge and/or function as charge traps. Exciton can form on the host compounds and energy transfer to the dopant. Exciton can also form directly on the dopant molecule depending on the emitting mechanism. With certain transport properties from the host compounds and dopants, these embodiments can ensure that the recombination zone is away from the interfaces to improve device performance.

Figure 4:
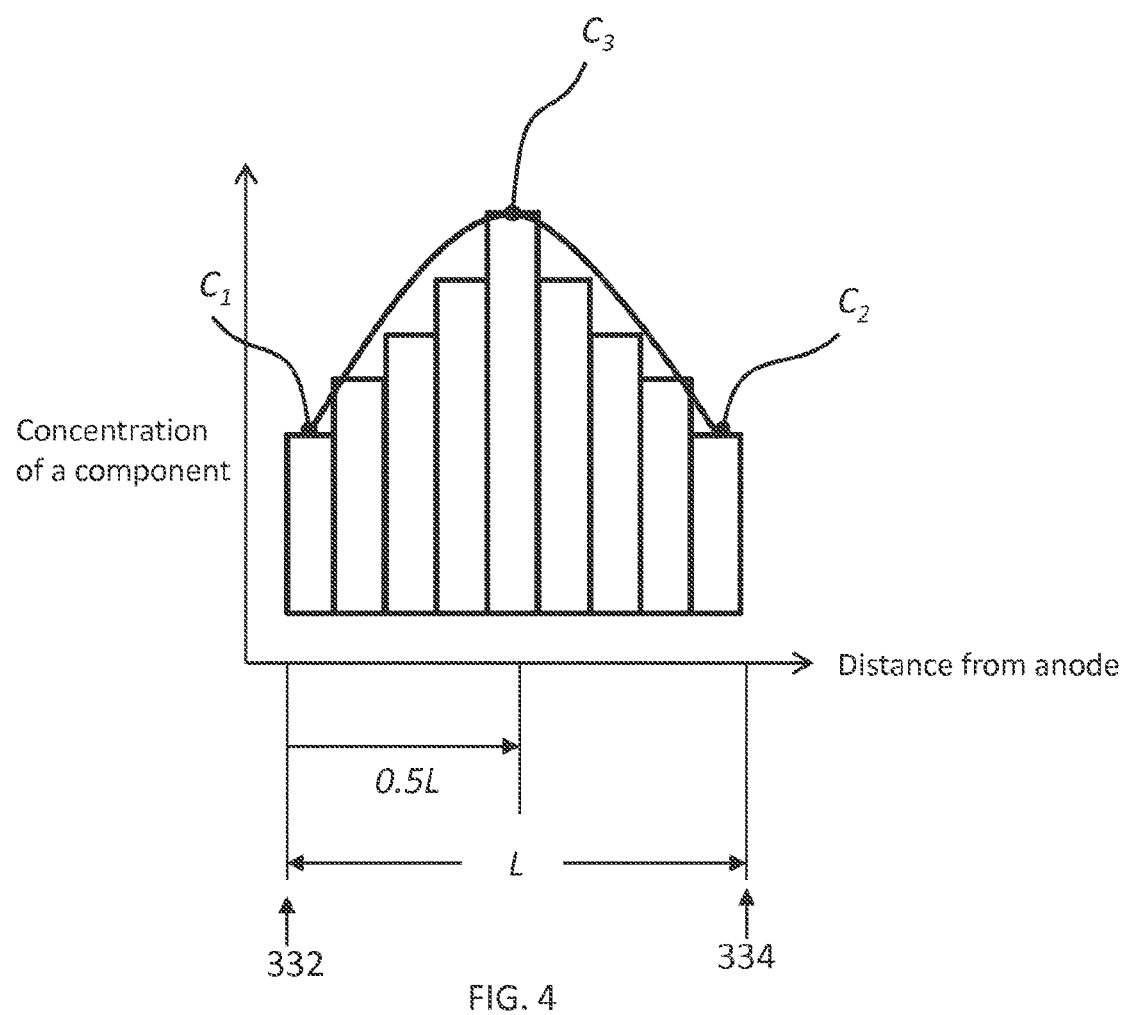
FIG. 4 shows a concentration profile that the initial concentration and the final concentration is identical at the anode and the cathode side.

Referring to FIG. 4, in one embodiment where the first concentration gradient has a profile where the third concentration level $C_3$ is the maximum concentration level and, thus, is greater than the first concentration level $C_1$ and the second concentration level $C_2$, the first concentration level $C_1$ is equal to the second concentration level $C_2$. The third concentration level $C_3$ can be located anywhere between the first region and the second region. In this embodiment, the composition of the first organic layer at near the anode (the first region) and at near the cathode (the second region) provide similar injection and transporting properties for holes and electrons, respectively, when $C_1$ and $C_2$ are equal. The dopant may not trap charges well inside the emissive layer. The initial increase and then decrease in concentration can move the recombination to the middle and result in a broadened recombination zone, which is beneficial to improving device performance.

Figure 5:
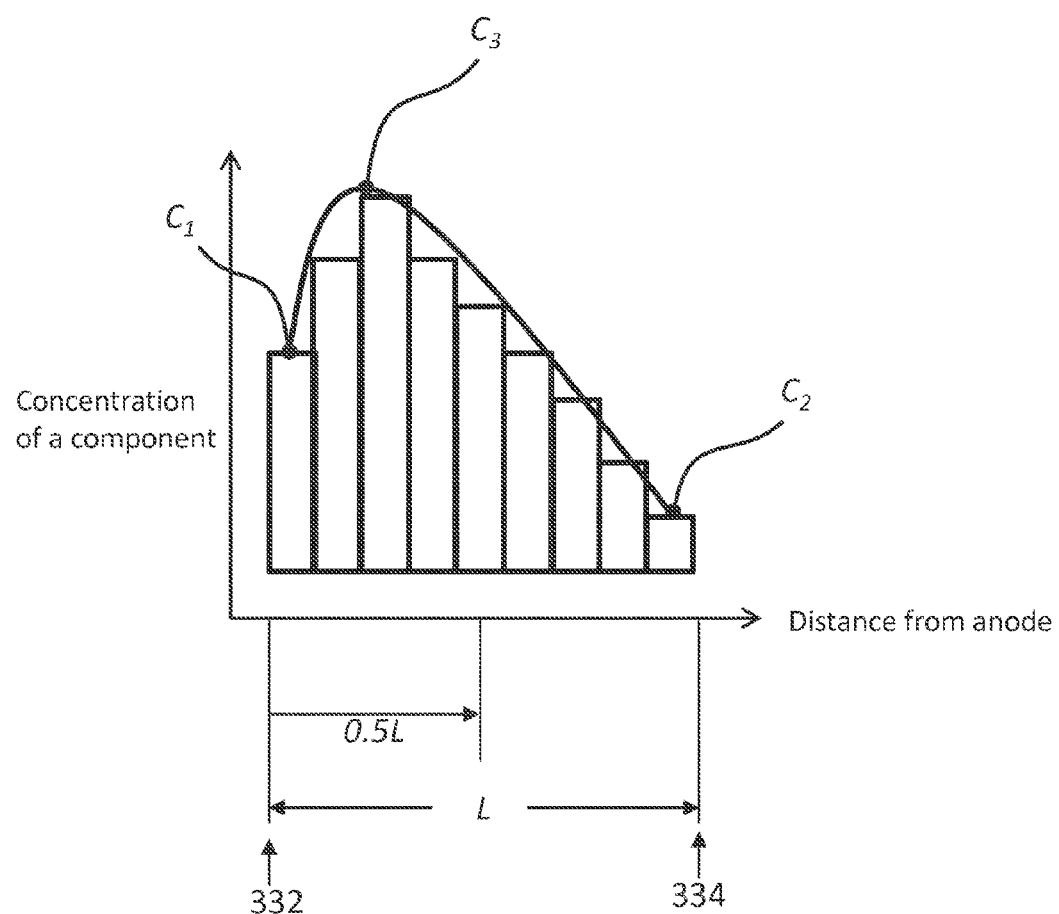
FIG. 5 shows a concentration profile that the initial concentration of the component close to the anode side is higher than the final concentration of the component close to the cathode side.

Referring to FIG. 5, in another embodiment where the first concentration gradient has a profile wherein the third concentration level $C_3$ is the maximum concentration level and, thus, is greater than the first concentration level $C_1$ and the second concentration level $C_2$, the first concentration level $C_1$ is greater than the second concentration level $C_2$. The third concentration level $C_3$ can be located anywhere between the first region and the second region. In this embodiment, the emissive layer may be more hole transporting or more electron transporting at certain concentration. $C_1$ and $C_2$ being different can balance the hole and electron injection and transport from each electrode. The dopant may not trap charges well inside the emissive layer. The initial increase and then decrease in concentration can move the recombination to the middle and result in a broadened recombination zone, which is beneficial to improving device performance.

Figure 6:
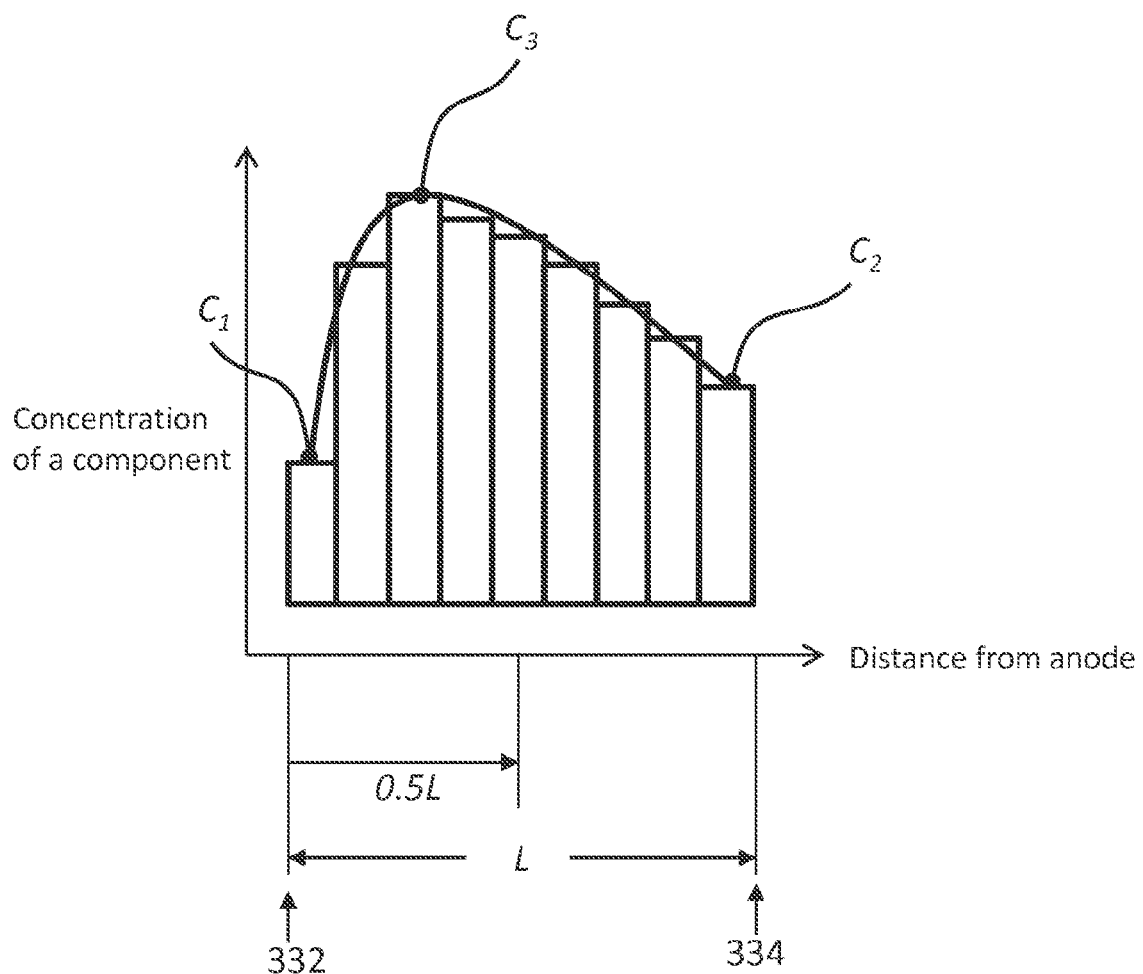
FIG. 6 shows a concentration profile that the initial concentration of the component close to the anode side is lower than the final concentration of the component close to the cathode side.

Referring to FIG. 6, in another embodiment where the first concentration gradient has a profile wherein the third concentration level $C_3$ is the maximum concentration level and, thus, is greater than the first concentration level $C_1$ and the second concentration level $C_2$, the first concentration level $C_1$ is less than the second concentration level $C_2$. The third concentration level $C_3$ can be located anywhere between the first region and the second region. In this embodiment, the emissive layer may be more hole transporting or more electron transporting at certain concentration. $C_1$ and $C_2$ being different can balance the hole and electron injection and transport from each electrode. The dopant may not trap charges well inside the emissive layer. The initial increase and then decrease in concentration can move the recombination to the middle and result in a broadened recombination zone, which is beneficial to improving device performance.

Figure 8:
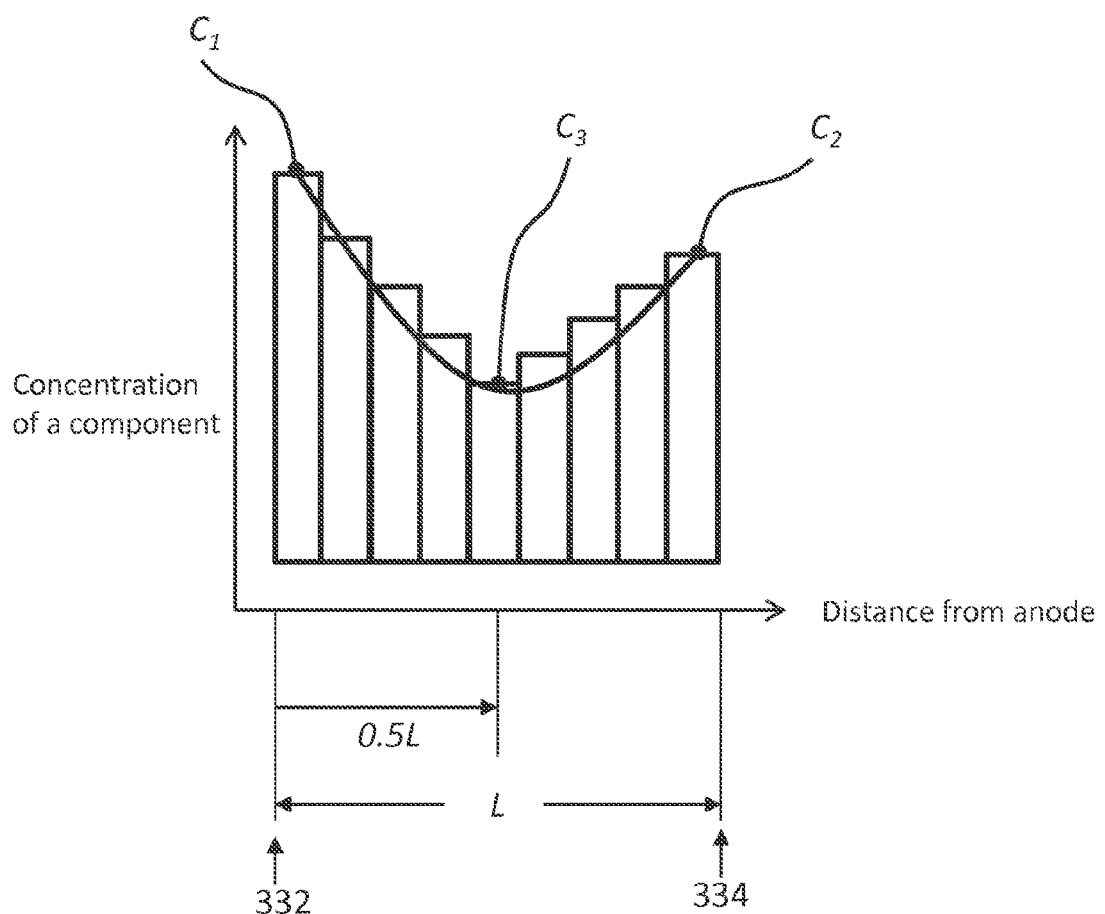
FIG. 8 shows another concentration profile in which the concentration of a component in the organic layer first decreases then increases gradually or stepwise.
Figure 9:
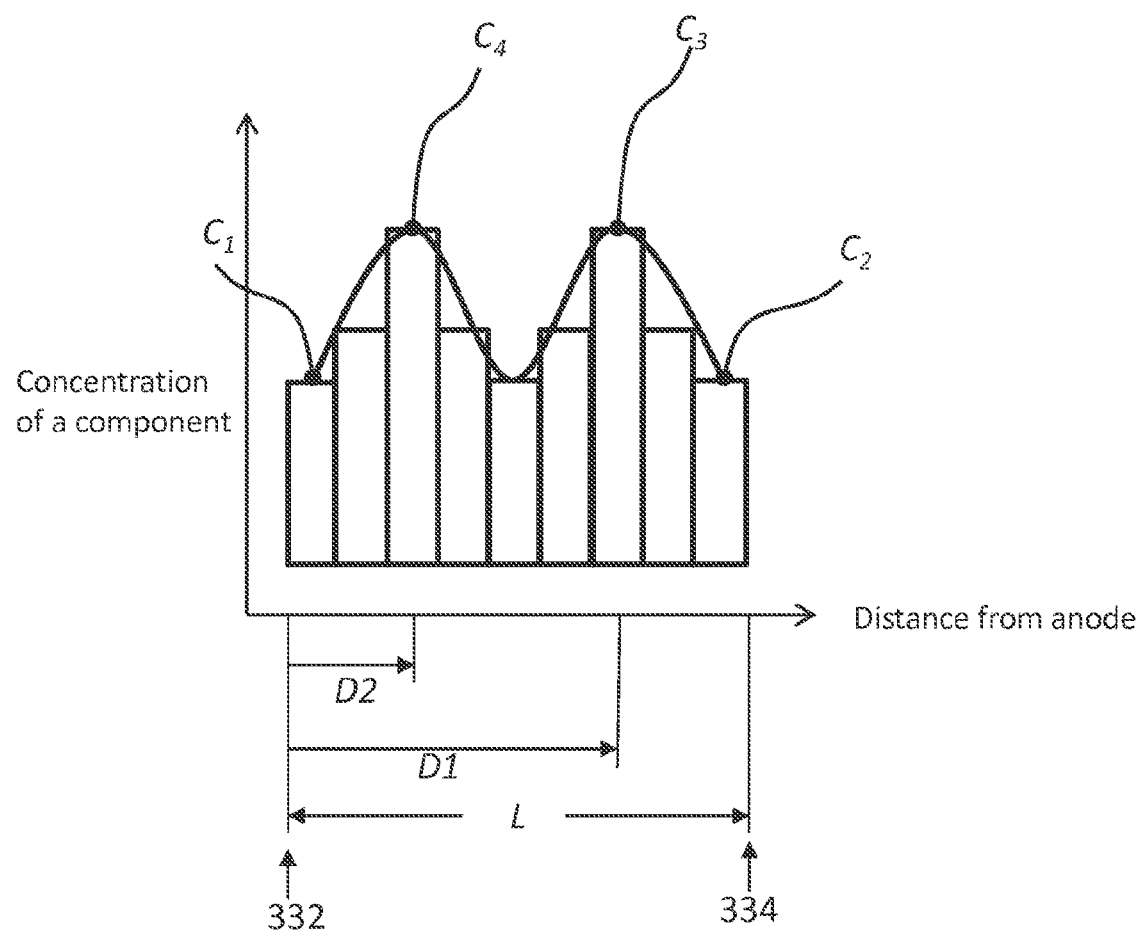
FIG. 9 shows another concentration profile in which the concentration of a component in the organic layer has two maximum concentration levels.

Referring to FIG. 8, in one embodiment, the first concentration gradient can have a profile that has more than one maximum concentration levels between the first planar surface 332 and the second planar surface 334 and the third concentration level $C_3$ can be a first maximum concentration level. In another embodiment, the first concentration gradient can have at least two concentration level peaks within the organic layer. In other words, the concentration level of a dopant in the organic layer first increases to the level $C_3$ going away from the anode side, then decreases, then increases again to a fourth concentration level $C_4$ that is a second peak and decreases again, thus having at least two concentration level peaks. As such, FIG. 8 shows an example where the first concentration gradient has the fourth concentration level $C_4$ at a distance less than 0.5 L but greater than 0.1 L from the second planar surface, i.e. between 0.5 L and the second region. In one embodiment, the third concentration level $C_3$ and the fourth concentration level $C_4$ can both be the maximum concentration level. In other words, $C_3$ and $C_4$ are the same value. In another embodiment, $C_3$ and $C_4$ are local peak values but different values so that either $C_3$ is greater than $C_4$ or $C_4$ is greater than $C_3$. The transporting and trapping properties of the dopant can vary at different concentrations as well as different electric field strength. This doping profile provides versatile tuning for recombination zone. In addition, it may provide multiple positions for recombination, further broaden the recombination zone.

In all embodiments where the first concentration gradient has a profile wherein the third concentration level $C_3$ is the maximum concentration level and, thus, is greater than the first concentration level $C_1$ and the second concentration level $C_2$, the third concentration level $C_3$ can be at a distance less than 0.4 L but greater than 0.1 L from the first planar surface 332. In such embodiments, when the dopant does not trap holes efficiently and holes can leak through the EML, the device efficiency is reduced. On the other hand, if the dopant can transport electron efficiently, it may be beneficial to have a higher concentration level of the dopant close to the anode side to push the recombination toward the anode side. The particular location of the concentration level $C_3$ in terms of its distance from the first planar surface 332 is determined by the transporting properties of the EML to achieve the best balance. In another embodiment, the third concentration level $C_3$ can be at a distance less than 0.3 L but greater than 0.1 L from the first planar surface 332.

According to one embodiment of the device, the first organic layer further comprises a second dopant material that has a concentration level in the first organic layer that is between 0.1 to 90 wt. % and is generally constant throughout the first organic layer along a direction parallel to the first and second planar surfaces; wherein the second dopant material's concentration level in the first organic layer along a direction perpendicular to the first and second planar surfaces, is not generally constant and defines a second concentration gradient along the direction perpendicular to the first and second planar surfaces. The introduction of a second dopant material can sometimes be advantageous to the device performance. For example, the second dopant may provide better stability to holes or electrons. It may affect the charge transporting properties of the emissive layer and alter the recombination zone. It can also serve as exciton formation center and energy transfer to the emitting dopants. Therefore, it will eliminate certain burden from the first dopant.

Figure 7:
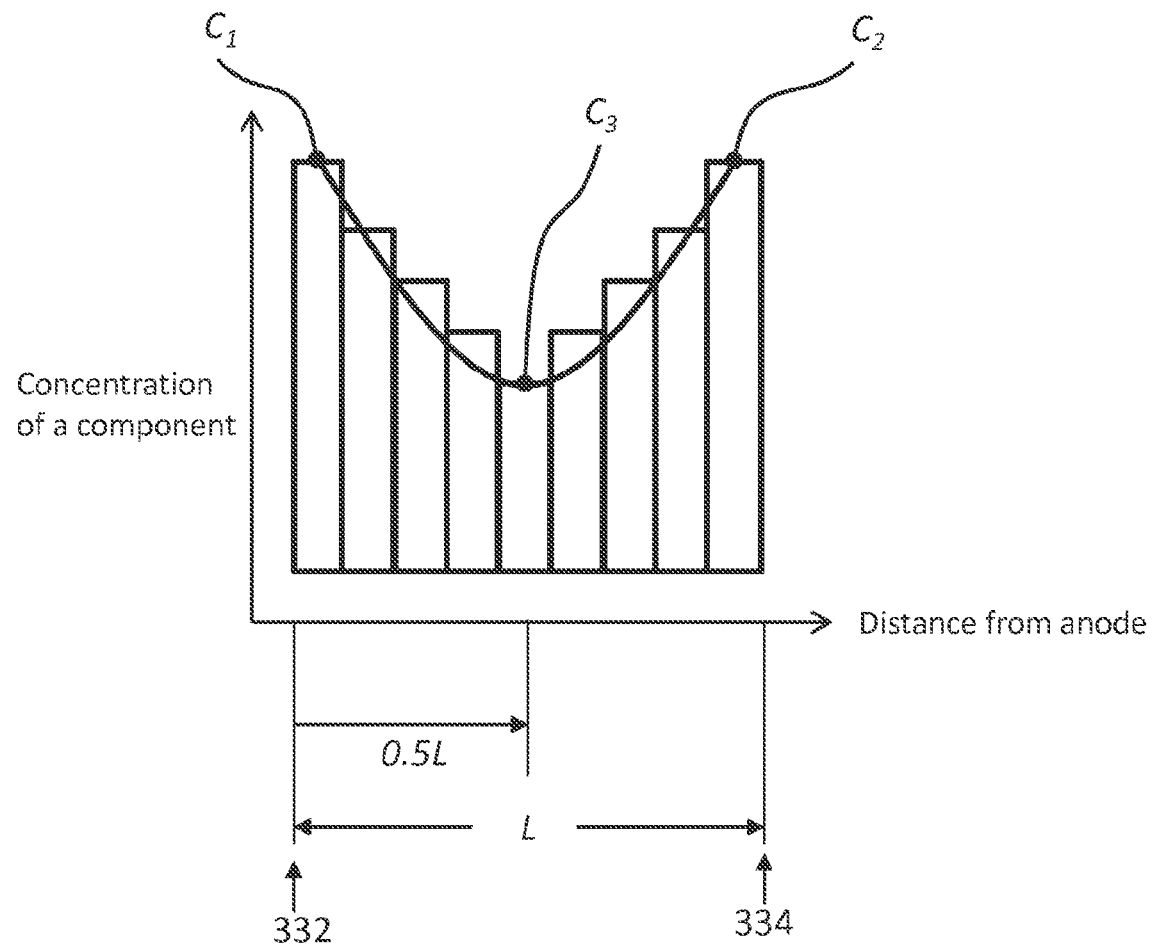
FIG. 7 shows a concentration profile in which the concentration of a component in the organic layer first decreases then increases gradually or stepwise.
Figure 10:
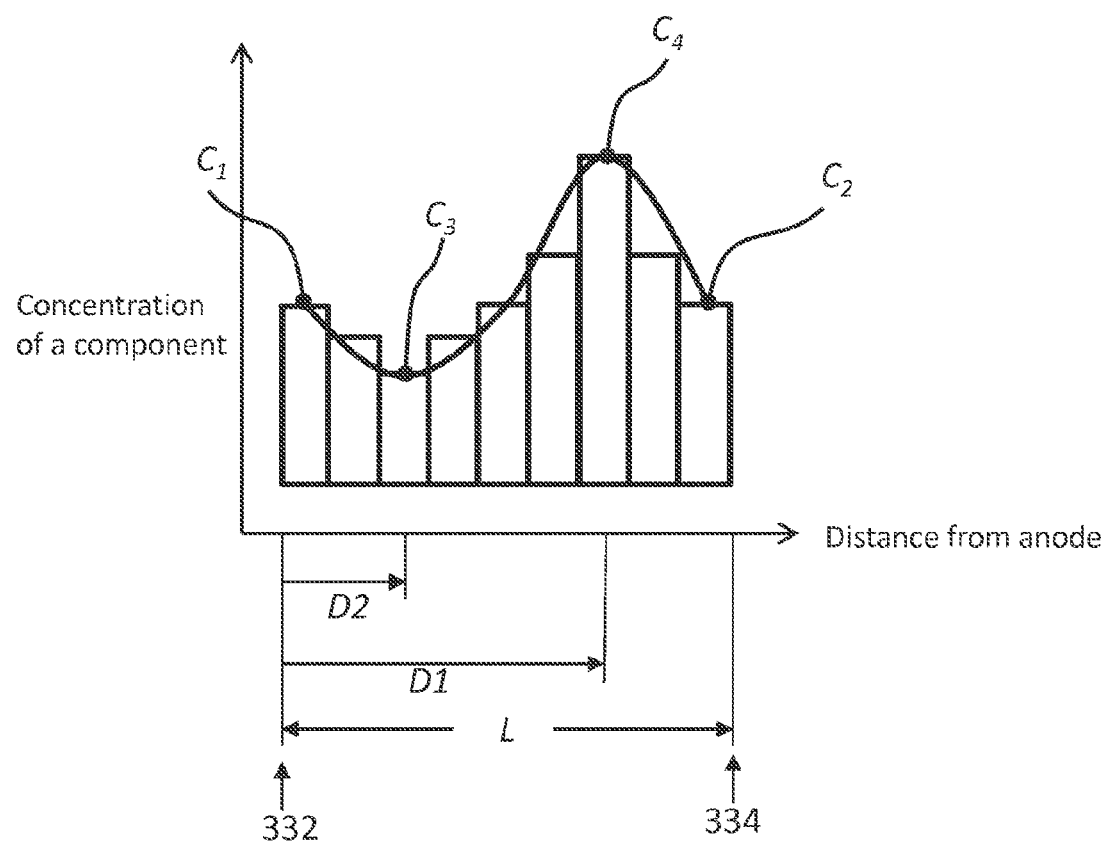
FIG. 10 shows a concentration profile in which the concentration of a component in the organic layer has one minimum concentration level and one maximum concentration level.
Figure 11:
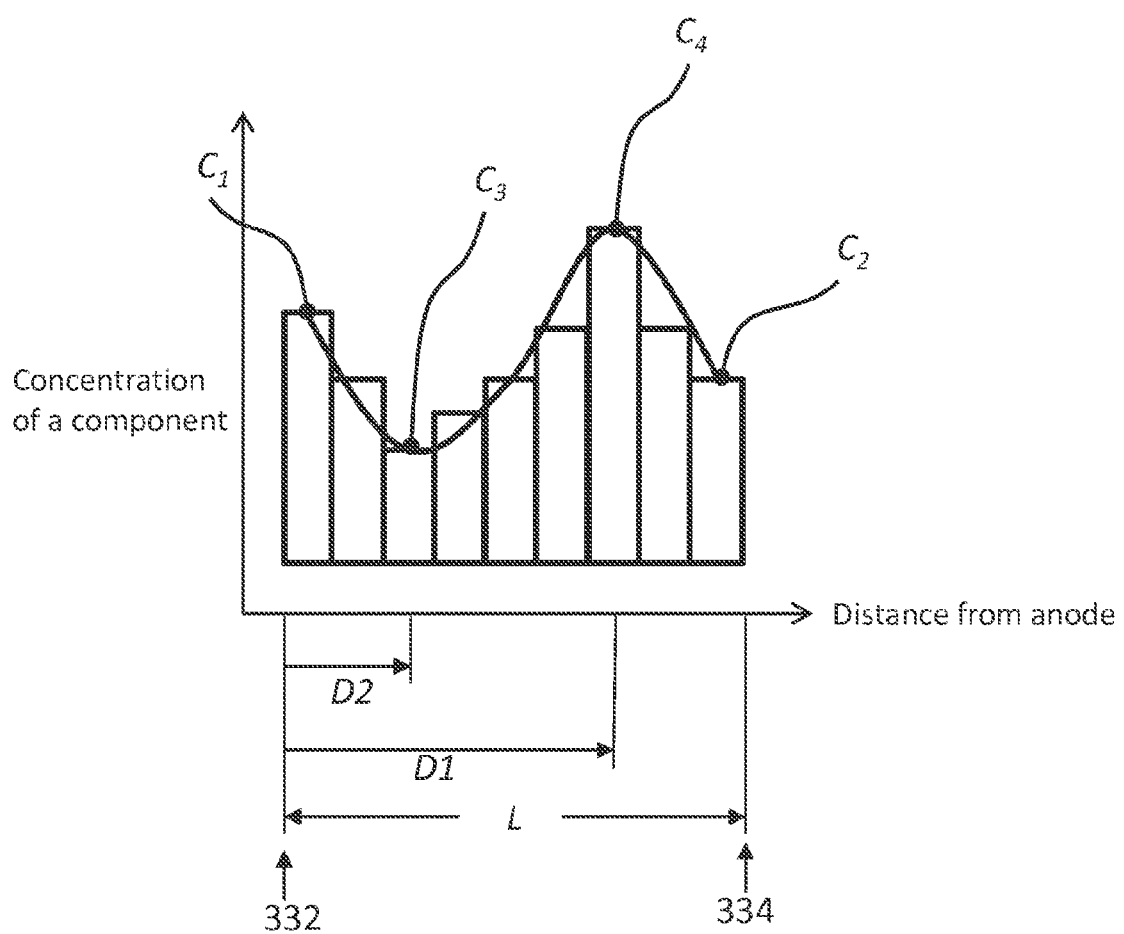
FIG. 11 shows another concentration profile in which the concentration of a component in the organic layer has one minimum concentration level and one maximum concentration level.

Referring to FIGS. 7, 8 and 10, according to another embodiment of the device, the first concentration gradient has a profile wherein the third concentration level $C_3$ is the minimum level in the concentration gradient profile and is lower than the first concentration level $C_1$ and the second concentration level $C_2$. In this embodiment, if the dopant has a shallow HOMO energy level, it can trap holes at low concentration and carry holes when the concentration increases. Having $C_3$ lower than $C_1$ will reduce the hole transport and prevent hole leakage to the cathode side. Depending on the transporting properties of the composition with $C_1$ and $C_2$, the concentration can be adjusted to achieve the best charge injection and transport Referring to FIG. 7, in the embodiment where the first concentration gradient has a profile where the third concentration level $C_3$ is the minimum concentration level and, thus, is lower than the first concentration level $C_1$ and the second concentration level $C_2$, the first concentration level $C_1$ can be equal to the second concentration level $C_2$. In this embodiment, the equality of $C_1$ and $C_2$ provides best balance for charge injection and transport. In one embodiment, the first concentration level $C_1$ can be different than the second concentration level $C_2$. Referring to FIG. 8, in another embodiment, the first concentration level $C_1$ can be greater than the second concentration level $C_2$.

In the embodiments where the first concentration gradient has a profile where the third concentration level $C_3$ is the minimum concentration level and, thus, is lower than the first concentration level $C_1$ and the second concentration level $C_2$, the third concentration level $C_3$ can be at a distance greater than 0.5 L from the first planar surface 332. In another embodiment, the third concentration level $C_3$ can be at a distance less than 0.3 L from the first planar surface. In another embodiment, the third concentration level $C_3$ can be at a distance between 0.3 L to 0.7 L from the first planar surface.

In another embodiment where the first concentration gradient has a profile where the third concentration level $C_3$ is lower than the first concentration level $C_1$ and the second concentration level $C_2$, there can be more than one minimum concentration level points between the first planar surface 332 and the second planar surface 334 and the third concentration level $C_3$ is a first minimum concentration level between the first planar surface and the second planar surface. In another embodiment, the first concentration gradient further has a fourth concentration level $C_4$ that is a second minimum concentration level between the first planar surface and the second planar surface. The first and second concentration levels $C_1$ and $C_2$ can be equal or different as described above. The location of the third concentration level $C_3$ can be at a distance between 0.3 L to 0.7 L from the first planar surface as described above.

Referring to FIG. 10, in another embodiment where the first concentration gradient has a profile where the third concentration level $C_3$ is the minimum concentration level and, thus, is lower than the first concentration level $C_1$ and the second concentration level $C_2$, the first concentration gradient can further include a fourth concentration level $C_4$ that is a maximum concentration level greater than the first concentration level $C_1$ and the second concentration level $C_2$. In the embodiment shown in FIG. 10, the first concentration level $C_1$ and the second concentration level $C_2$ are equal level. In the embodiment shown in FIG. 11, the first concentration level $C_1$ is greater than the second concentration level $C_2$.

In another embodiment where the first concentration gradient has a profile where the third concentration level $C_3$ is the minimum concentration level and, thus, is lower than the first concentration level $C_1$ and the second concentration level $C_2$, the third concentration level $C_3$ is a first minimum concentration level between the first planar surface 332 and the second planar surface 334, and there is a fourth concentration level $C_4$ that is different from the third concentration level. As shown in the embodiment of FIG. 10, the third concentration level $C_3$ is located at a first distance D1 from the first planar surface and the fourth concentration level $C_4$ is at a second distance D2 from the first planar surface, wherein the first distance D1 is less than the second distance D2. The fourth concentration level $C_4$ can be a maximum concentration level as shown in FIG. 10.

Figure 12:
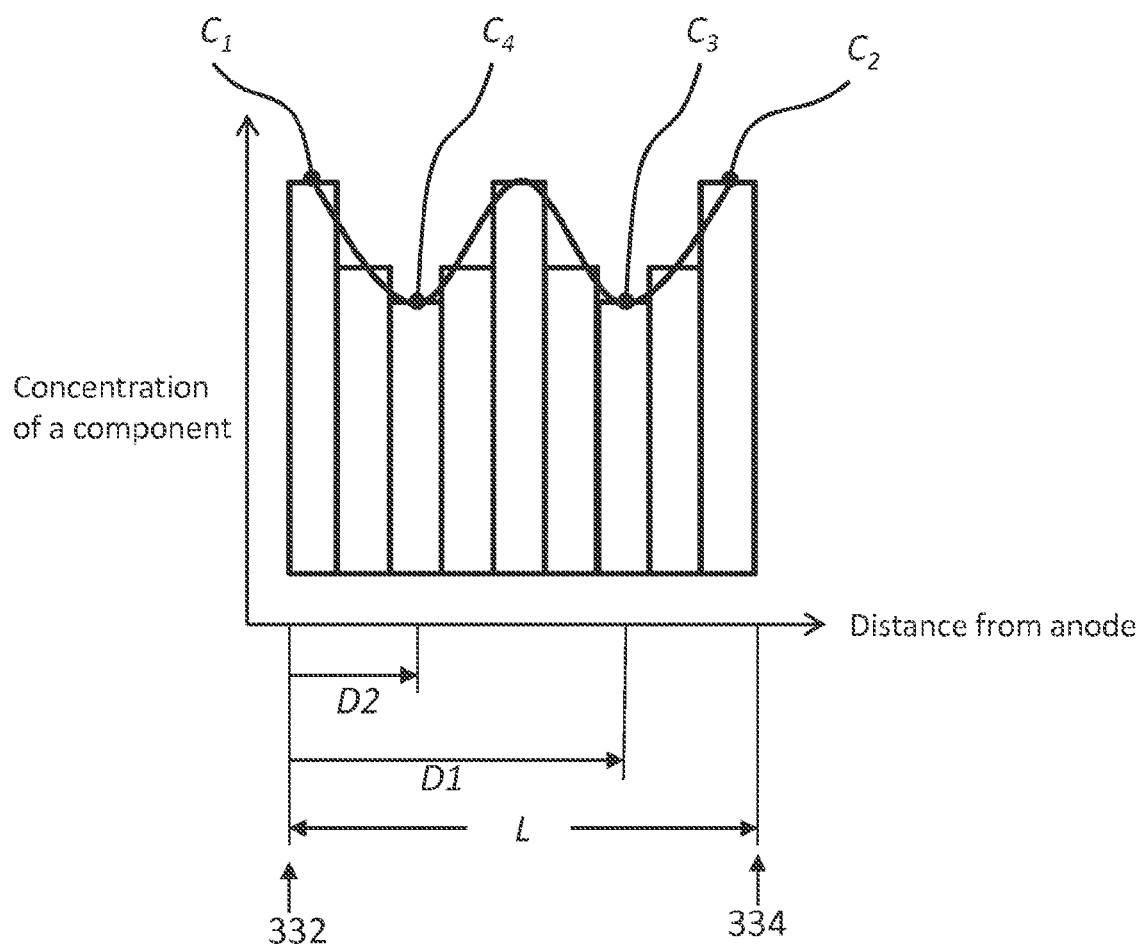
FIG. 12 shows a concentration profile in which the concentration of a component in the organic layer has two minimum concentration levels.

Referring to FIG. 12, in another embodiment, the fourth concentration level $C_4$ can be a second minimum concentration level and located at a second distance D2 from the first planar surface whereas the third concentration level $C_3$ is located at a first distance D1 from the first planar surface, where D1 is greater than the second distance D2. $C_3$ and $C_4$ can have the same concentration level values. In some embodiments, $C_3$ and $C_4$ can be different concentration level values, in which case one of them is a local minimum concentration level value.

Referring to FIG. 12, in another embodiment, another one or multiple concentration minimum levels are located between the distance 0 to L. The first concentration level $C_1$ and the second concentration $C_2$ can be same or different. In this scenario, a dopant with good hole transporting property at high doping concentration and good trapping property at low doping concentration can be used. The recombination zone can be confined close to the minimum concentration levels and the high doping concentration region functions as transporting region.

In another embodiment where the first concentration gradient has a profile where the third concentration level $C_3$ is lower than the first concentration level $C_1$ and the second concentration level $C_2$, first organic layer further comprises a second dopant material that has a concentration level in the first organic layer that is between 0.1 to 90 wt. % and is generally constant throughout the first organic layer along a direction parallel to the first and second planar surfaces; wherein the second dopant material has a concentration level in the first organic layer along a direction perpendicular to the first and second planar surfaces, that is not generally constant and defines a second concentration gradient along the direction perpendicular to the first and second planar surfaces.

In the embodiment where the first concentration gradient has a profile wherein the third concentration level $C_3$ is greater than the first concentration level $C_1$ and the second concentration level $C_2$, the first material can have a fourth concentration level $C_4$ that is a second maximum concentration.

In the embodiment where the first concentration gradient has a profile wherein the third concentration level $C_3$ is greater than the first concentration level $C_1$ and the second concentration level $C_2$, the first organic layer can further comprise a second material, and wherein the second material has a second concentration gradient profile in the first organic layer between the first surface and the second surface along the direction perpendicular to the anode and the cathode.

In an alternative preferred embodiment, the gradient profile is modified such that concentration level of the dopant in the first organic layer drops down to effectively close to zero, (e.g., less than 5% of the lowest concentration of the remaining portion of the layer). This zero concentration point can be somewhere between the first planar surface 332 and the second planar surface 334 is, thereby providing a gap between two doped portions in the single first organic layer.

The various dopant concentration gradient profiles disclosed herein can be implemented in a device form as continuous gradients, as represented by the continuous curves in the profiles illustrated in FIGS. 4-12, or stepwise gradients, as represented by the overlaid bar graph form illustrated in FIGS. 4-12. If the continuous gradient profile is implemented, the organic layer can be deposited using a suitable deposition method in a manner that the concentration level of the dopant material is continuously changed during the deposition process depositing the organic layer of thickness L. If the stepwise gradient profile is implemented, the organic layer can be deposited using a suitable deposition method in a manner that the concentration level of the dopant material is changed in a predetermined interval during the deposition process depositing the organic layer of thickness L. Some examples of suitable deposition methods for the organic layer are discussed earlier in this disclosure.

According to an aspect of the inventive devices disclosed herein, the first organic layer is a light emitting layer and the dopant material is a light emitting material.

According to an aspect of the inventive devices disclosed herein, the dopant material is a phosphorescent light emitting material.

According to an aspect of the inventive devices disclosed herein, the dopant material is a non-light emitting layer.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, cell phones, tablets, phablets, personal digital assistants (PDAs), laptop computers, digital cameras, camcorders, viewfinders, micro-displays, 3-D displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.), but could be used outside this temperature range, for example, from −40 degree C. to +80 degree C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

According to another aspect of the present disclosure, a device that includes one or more organic light emitting devices is also provided. At least one of the one or more organic light emitting devices can include an anode, a cathode, and an organic layer disposed between the anode and the cathode. The organic layer may include a host and a phosphorescent dopant.

The device can be one or more of a consumer product, an electronic component module, an organic light-emitting device and a lighting panel. The organic layer can be an emissive layer and the compound can be an emissive dopant in some embodiments, while the compound can be a non-emissive dopant in other embodiments.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising one or more organic light emitting devices, at least one of the organic light emitting devices comprising:
    an anode;
    a cathode that is parallel to the anode; and
    a first organic layer disposed between the anode and the cathode and having a first planar surface and a second planar surface that are parallel to the anode and the cathode and defining a perpendicular distance L, representing the thickness of the first organic layer, between the first planar surface and the second planar surface, wherein the anode is closer to the first planar surface than the second planar surface;
    wherein the first organic layer comprises a dopant material and a host material;
    wherein the dopant material has a concentration level in the first organic layer that is between 0.1 to 90 wt. % and is generally constant throughout the first organic layer along a direction parallel to the first and second planar surfaces;
    wherein the dopant material's concentration level in the first organic layer along a direction perpendicular to the first and second planar surfaces, is not generally constant and defines a first concentration gradient along the direction perpendicular to the first and second planar surfaces;
    wherein the first concentration gradient has a first concentration level $C_1$ within a distance of no more than 0.1 L from the first planar surface, a second concentration level $C_2$ within a distance of no more than 0.1 L from the second planar surface, and a third concentration level $C_3$ at a distance less than 0.5 L but greater than 0.1 L from the first planar surface, wherein the third concentration level $C_3$ is greater than the first concentration level $C_1$ and the second concentration level $C_2$.

2. The device of claim 1, wherein the first concentration level $C_1$ can be equal to or different from the second concentration level $C_2$.

3. The device of claim 1, wherein the third concentration level $C_3$ is a first maximum concentration level.

4. The device of claim 3, wherein the first concentration gradient has a fourth concentration level $C_4$ at a distance less than 0.5 L but greater than 0.1 L from the second planar surface, wherein the fourth concentration level $C_4$ is a second maximum concentration level.

5. The device of claim 1, wherein the first organic layer is a light emitting layer, and the dopant material is a light emitting material.

6. The device of claim 1, wherein the first organic layer is a non-light emitting layer.

7. The device of claim 1, wherein the first organic layer further comprises a second dopant material that has a concentration level in the first organic layer that is between 0.1 to 90 wt. % and is generally constant throughout the first organic layer along a direction parallel to the first and second planar surfaces;

wherein the second dopant material's concentration level in the first organic layer along a direction perpendicular to the first and second planar surfaces, is not generally constant and defines a second concentration gradient along the direction perpendicular to the first and second planar surfaces.

8. A device comprising one or more organic light emitting devices, at least one of the organic light emitting devices comprising:

an anode;
a cathode that is parallel to the anode; and
a first organic layer disposed between the anode and the cathode and having a first planar surface and a second planar surface that are parallel to the anode and the cathode and having a perpendicular distance L between the first planar surface and the second planar surface, wherein the anode is closer to the first planar surface than the second planar surface;
wherein the first organic layer comprises a dopant material and a host material;
wherein the dopant material has a concentration level in the first organic layer that is between 0.1 to 90 wt. % and is generally constant throughout the first organic layer along a direction parallel to the first and second planar surfaces;
wherein the dopant material's concentration level in the first organic layer along a direction perpendicular to the first and second planar surfaces, is not generally constant and defines a first concentration gradient along the direction perpendicular to the first and second planar surfaces;
wherein the first concentration gradient has a first concentration level $C_1$ within a distance no more than 0.1 L from the first planar surface, a second concentration level $C_2$ within a distance 0.1 L from the second planar surface; and a third concentration level at a distance less than 0.5 L but greater than 0.1 L from the first planar surface, wherein the third concentration level $C_3$ is lower than the first concentration level $C_1$ and the second concentration level $C_2$.

9. The device of claim 8, wherein the first concentration level $C_1$ can be equal to or different from the second concentration level $C_2$.

10. The device of claim 8, wherein the third concentration level $C_3$ is a first minimum concentration level.

11. The device of claim 8, wherein the first concentration gradient has a fourth concentration level $C_4$ that is a second minimum concentration level.

12. The device of claim 8, wherein the first concentration gradient has a fourth concentration level $C_4$ that is greater than the first concentration level $C_1$ and the second concentration level $C_2$.

13. The device of claim 8, wherein the first organic layer is a non-light emitting layer or a light emitting layer wherein the dopant material is a light emitting material.

14. The device of claim 8, wherein the first organic layer further comprises a second dopant material that has a concentration level in the first organic layer that is between 0.1 to 90 wt. % and is generally constant throughout the first organic layer along a direction parallel to the first and second planar surfaces;

wherein the second dopant material has a concentration level in the first organic layer along a direction perpendicular to the first and second planar surfaces, that is not generally constant and defines a second concentration gradient along the direction perpendicular to the first and second planar surfaces.

15. A device comprising one or more organic light emitting devices, at least one of the organic light emitting devices comprising:

an anode;
a cathode that is parallel to the anode; and
a first organic layer disposed between the anode and the cathode and having a first planar surface and a second planar surface that are parallel to the anode and the cathode and having a perpendicular distance L between the first planar surface and the second planar surface, wherein the anode is closer to the first planar surface than the second planar surface;
wherein the first organic layer comprises a dopant material and a host material;
wherein the dopant material has a concentration level in the first organic layer that is between 0.1 to 90 wt. % and is generally constant throughout the first organic layer along a direction parallel to the first and second planar surfaces;
wherein the dopant material's concentration level in the first organic layer, along a direction perpendicular to the first and second planar surfaces, is not generally constant and defines a first concentration gradient along the direction perpendicular to the first and second planar surfaces;
wherein the first concentration gradient has a first concentration level $C_1$ within a distance of no more than 0.1 L from the first planar surface, a second concentration level $C_2$ within a distance of no more than 0.1 L from the second planar surface, and a third concentration level $C_3$ that is greater than the first concentration level $C_1$ and the second concentration level $C_2$;
wherein the first concentration level $C_1$ is greater than or equal to the second concentration level $C_2$.

16. The device of claim 15, wherein the third concentration level $C_3$ is at a distance greater than 0.5 L from the first surface.

17. The device of claim 15, wherein the third concentration level $C_3$ is a first maximum concentration.

18. The device of claim 15, wherein the first material has a fourth concentration level $C_4$ wherein the fourth concentration level $C_4$ is a second maximum concentration.

19. The device of claim 15, wherein the organic layer is either a non-light emitting layer or a light emitting layer wherein the first material is a light emitting material.

20. The device of claim 15, wherein the first organic layer further comprises a second dopant material that has a concentration level in the first organic layer that is between 0.1 to 90 wt. % and is generally constant throughout the first organic layer along a direction parallel to the first and second planar surfaces;

wherein the second dopant material's concentration level in the first organic layer along a direction perpendicular to the first and second planar surfaces, is not generally constant and defines a second concentration gradient along the direction perpendicular to the first and second planar surfaces.

* * * * *